US 8,690,651 B2

(12) United States Patent
Honold et al.

(10) Patent No.: US 8,690,651 B2
(45) Date of Patent: Apr. 8, 2014

(54) RACK SYSTEM AND METHOD OF DETERMINING A CLIMATE CONDITION THEREOF

(75) Inventors: Olivier Honold, Erienbach (CH); Rupert Reiter, Dietersburg (DE); Martin Gallmann, Würenlos (CH)

(73) Assignee: Knurr AG, Arnstorf (DE)

( * ) Notice: Subject to any disclaimer, the term of this patent is extended or adjusted under 35 U.S.C. 154(b) by 894 days.

(21) Appl. No.: 12/742,003

(22) PCT Filed: Jun. 17, 2008

(86) PCT No.: PCT/EP2008/004871
§ 371 (c)(1),
(2), (4) Date: Jul. 14, 2010

(87) PCT Pub. No.: WO2009/059649
PCT Pub. Date: May 14, 2009

(65) Prior Publication Data
US 2010/0304657 A1    Dec. 2, 2010

(30) Foreign Application Priority Data
Nov. 9, 2007    (EP) .................................... 07021813

(51) Int. Cl.
*H05K 5/00*    (2006.01)
(52) U.S. Cl.
USPC ........................................................ 454/184
(58) Field of Classification Search
USPC .......................................... 454/184; 361/695
See application file for complete search history.

(56) References Cited

U.S. PATENT DOCUMENTS

| 6,034,873 | A  | * | 3/2000 | Ståhl et al. ..................... 361/701 |
| 6,672,955 | B2 |   | 1/2004 | Charron |
| 2003/0050003 | A1 |   | 3/2003 | Charron |
| 2003/0067745 | A1 |   | 4/2003 | Patel et al. |
| 2005/0099770 | A1 |   | 5/2005 | Fink |

(Continued)

FOREIGN PATENT DOCUMENTS

| JP | 2007316989 A | * | 12/2007 |
| JP | 2009257730 A | * | 11/2009 |
| WO | 2006/124240 A2 |  | 11/2006 |

OTHER PUBLICATIONS

International Search Report of PCT/EP2008/004871, mailing date of Dec. 19, 2008.

(Continued)

*Primary Examiner* — Steven B McAllister
*Assistant Examiner* — Brittany E Towns
(74) *Attorney, Agent, or Firm* — Westerman, Hattori, Daniels & Adrian, LLP

(57) ABSTRACT

A rack system (100) comprises a plurality of racks (105) arranged to form at least one aisle (120) between them. The aisle (120) is sealed such that essentially all of a cooling medium supplied to the aisle (120) passes through the racks (105). A bleeding opening is provided for enabling a bleeding of the cooling medium out of the aisle (120) and an entering of an ambient medium into the aisle (120). A sensor (such as a temperature sensor) is arranged to determine a medium flow direction through the bleeding opening. In one embodiment, a signal generated by the sensor is used to control at least one parameter of the cooling medium supplied to the aisle (120).

23 Claims, 10 Drawing Sheets

(56) References Cited

U.S. PATENT DOCUMENTS

| | | |
|---|---|---|
| 2005/0187664 A1 | 8/2005 | Bash et al. |
| 2006/0139877 A1 | 6/2006 | Germagian et al. |
| 2006/0168975 A1 | 8/2006 | Malone et al. |
| 2006/0260338 A1 | 11/2006 | VanGilder et al. |
| 2007/0135032 A1 | 6/2007 | Wang |
| 2009/0107652 A1 | 4/2009 | VanGilder et al. |
| 2009/0277605 A1 | 11/2009 | VanGilder et al. |
| 2010/0190430 A1* | 7/2010 | Rodriguez et al. ............ 454/184 |
| 2010/0252233 A1* | 10/2010 | Absalom ........................ 165/57 |

OTHER PUBLICATIONS

Written Opinion of the International Searching Authority of PCT/EP2008/004871, mailing date of Dec. 19, 2008.

* cited by examiner

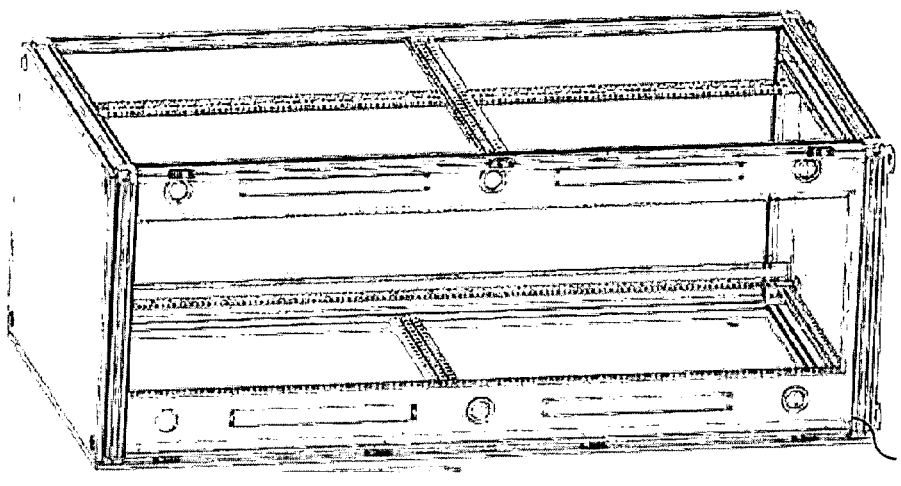
Fig. 6a
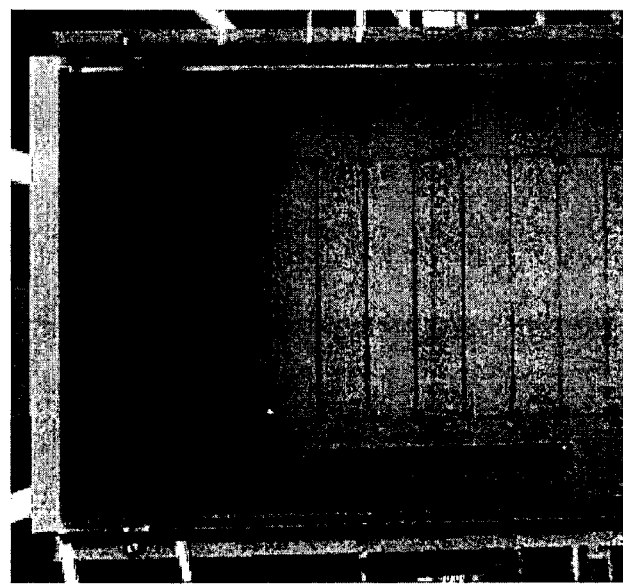
Fig. 6b
Fig. 6

RACK SYSTEM AND METHOD OF DETERMINING A CLIMATE CONDITION THEREOF

TECHNICAL FIELD

This invention relates to a rack system to which a cooling medium such as cooled air is supplied. The invention further relates to a method for determining a climate condition of the rack system. The climate condition of the rack system may, for example, be determined in context with controlling one or more climate parameters within the rack system.

BACKGROUND

Electrically powered equipment, including electronic devices such as computers, mass storage devices and switches, are often aggregated in so-called data centres. In the data centres, it has become common to store such equipment in racks. To allow for an easy servicing of the racks, the racks are often arranged in rows. Between two adjacent rows, an aisle is thus defined permitting servicing personal access to the equipment for installation, maintenance and removal purposes.

Most of the equipment housed inside the racks consumes enough electrical power to heat up the ambience. As there is often a thermal limit at which the equipment can be operated, steps for keeping the operational temperature underneath a critical level have to be taken. For example, many electrical devices such as computers are equipped with fans or other internal cooling mechanisms. These mechanisms generate a flow of a cooling medium such as ambient air through the devices for cooling the internal electronic components.

However, and in particular when the electrical devices are packed tightly in the racks, the cooling effect of ambient air is often not sufficient. Moreover, ambient air tends to heat up in data centres, and this fact additionally decreases the cooling efficiency. One approach to combat the heating up of ambient air is the installation of climate control systems in data centres. The climate control systems are configured to control ambient parameters such as the temperature and the humidity of the air inside the data centres.

It has been observed that in many data centres the flow around and into the racks of cooled and/or de-humidified air generated by the climate control systems is more or less arbitrary. This results in a poor cooling efficiency. In other words, the climate control systems consume more electrical power than actually necessary.

In order to increase the cooling efficiency, various techniques for concentrating and directing a flow of a cooling medium towards the racks have been proposed. In this regard, U.S. Pat. No. 6,672,955 B2 teaches an air flow management system wherein the aisles defined by two adjacent rows of racks are covered on a top end. This covering approach prevents the cooling medium supplied through the floor of the aisle from exiting the aisle in an upward direction. As another example, WO 2006/124240 A2 proposes baffles and doors to prevent an ambient medium from laterally entering the aisle. Thus, a mixing of the ambient medium with the cooling medium (which is again supplied through a floor of the aisle) can be prevented, and the cooling efficiency is thus increased. As a still further example, US 2005/0099770 A1 teaches to fully enclose the aisle and to supply the cooling medium from the outside through the racks. According to this approach, the heated-up cooling medium is then collected in the enclosed aisle and can be easily removed without mixing with the cooling medium.

SUMMARY

There is a need for determining a prevailing climate condition inside an aisle defined by a plurality of racks. Further, there is a need for efficiently controlling parameters of the cooling medium dependent on the determined climate condition.

According to one aspect, a rack system is provided comprising a plurality of racks arranged to form at least one aisle between them, wherein the aisle is sealed such that essentially all of a cooling medium supplied to the aisle passes through the racks; a bleeding opening for enabling bleeding of the cooling medium out of the aisle; and entering of ambient medium into the aisle, and a first sensor for determining a medium flow direction through the bleeding opening. The medium flow direction may be regarded as being indicative or representative of a climate condition of the rack system.

The cooling medium may be a gaseous medium. For example, air or nitrogen may be used in this regard. However, other cooling media known in the art may be used as well.

According to a first variant, the racks conform to an applicable industry standard. An exemplary industry standard specifies a rack width of 19 inch and a rack height of a certain number of predefined height units, with one height unit equaling 1.75 inches. In other variants, the racks may have customized dimensions. The plurality of racks in the rack system may each have the same height, width and depth. Each of the racks may have a supply side for supplying the cooling medium to the rack and a removal side opposite the supply side for removing the cooling medium from the rack. In one variation, the supply sides of the racks are arranged to face the interior of the aisle.

The first sensor may be located at any position suitable for determining a medium flow direction through the bleeding opening. The first sensor may, for example, be located closed to or in the bleeding opening. The first sensor can be any sensor capable of determining a medium flow direction. As an example, the first sensor may be selected from the set comprising a temperature sensor, an air screw and a sail-operated switch. The temperature sensor may, for example, operate on the principle that the temperature in the vicinity of the bleeding opening will be lower when the cooling medium flows through the bleeding opening out of the aisle compared to the situation when a (typically warmer) ambient medium flows through the bleeding opening into the aisle. An airscrew indicates the flow direction by turning in a direction corresponding to a flow direction of a medium acting upon the airscrew. As regards the sail-operated switch, the sail may be placed to catch some of the medium and to be turned into a direction corresponding to the medium flow direction, so as to operate the switch. In other cases, the first sensor may be configured to compare medium parameters on opposite sides of the bleeding opening. Such medium parameters may include the temperature and the pressure. Accordingly, the first sensor may comprise two or more individual sensor components.

Generally, the bleeding opening may be arranged in arbitrary positions with respect to the aisle. For example, the bleeding opening may be located at a top end, at a bottom end or somewhere between the top end and the bottom end of the aisle. The bleeding opening may be located essentially opposite to the location at which the cooling medium is supplied to the aisle. If, for example, the cooling medium is supplied from the bottom of the aisle, the bleeding opening may be located at the top end of the aisle, and vice versa.

The system may comprise a control mechanism adapted to control at least one parameter of the cooling medium supplied to the aisle dependent on a signal generated by the first sensor. The at least one parameter of the cooling medium controlled by the control mechanism may be selected from the set comprising a temperature, a humidity and a flow rate of the cooling medium. In some cases, it may be useful to control at least two or all three of these parameters. Moreover, one or two of these parameters could also be controlled independently from a signal generated by the first sensor (e.g., responsive to a signal generated by a second sensor). As there exists a physical relationship between temperature and humidity of the cooling medium, controlling one parameter (such as the temperature) may at the same time result in an accompanying control of the second parameter (such as the humidity).

In the following, various realizations and components of the control mechanism for controlling one or more parameters of the cooling medium will be described in more detail. For example, at least one conveyor may be provided for conveying the cooling medium into the aisle. The at least conveyor may be located in a flow direction of the cooling medium upstream or downstream of the aisle. In an upstream scenario the conveyor will thus push the cooling medium into the aisle, and in a downstream scenario the conveyor will suck the cooling medium out of the aisle.

The conveyor may be adapted to control a flow rate of the cooling medium supplied to the aisle dependent on a signal generated by the first sensor. The conveyor may further be adapted to control the flow rate dependent on signals of one or more additional or alternative sensors. The conveyor may, for example, comprise a fan having an adjustable speed.

The system may additionally comprise at least one climate control unit for controlling at least one of a temperature and a humidity of the cooling medium supplied to the aisle. According to a first variant, the conveyor is co-located with the climate control unit (e.g. in a single housing). According to a second variant, the conveyor is located remotely from the climate control unit.

The at least one climate control unit may be adapted to control at least one of the temperature and the humidity of the cooling medium dependent on a signal generated by the first sensor. Additionally, or in the alternative, such a control my be based on signals generated by one or more second sensors.

As mentioned above, one or more second sensors may be provided in addition to the first sensor. Accordingly, at least one of the control mechanism, the conveyor and the climate control unit may additionally, or alternatively, be controlled dependent on a signal generated by the second sensor. The second sensor may be located at a distance from at least one of the bleeding opening and the first sensor. In one variation, the second sensor is located far away from the plurality of racks. For example, the second sensor may be located in the vicinity of the climate control unit and/or the conveyor. In such a situation, the second sensor may be configured to determine medium parameters before the medium enters the climate control unit and/or the conveyor.

In one implementation, the system comprises a plurality of first sensors and/or a plurality of second sensors as well as a master control unit connected to at least one of the plurality of first sensors and the plurality of second sensors. The master control unit is configured to control at least one of the conveyor (e.g., responsive to the signals of at least the first sensors) and the climate control unit (e.g., responsive to the signals of at least the second sensors).

In the case a plurality of first sensors is provided, several first sensors (and several bleeding openings) may be associated with each aisle. Moreover, in the case where the plurality of racks is arranged to form several aisles, at least one first sensor (and at least one bleeding opening) may be associated with each aisle. The control operation of the master unit may in such configurations be responsive to a signal provided by the first sensor sensing the least favourable medium flow or climate condition. In the case the first sensors are configured as temperature sensors, the least favourable medium flow may be detected by the particular first sensor that senses the highest temperature.

The system may be configured such that a medium circulation path is created. The medium circulation path may include one or more aisles, the at least one climate control unit and the at least conveyor. In such a scenario, the one or more second sensors may be positioned in various locations along and adjacent to the circulation path. For example, the at least one second sensor may be situated in a position downstream of and close to the at least one conveyor, in a position close to the at least one climate control unit or in the flow path between the at least one climate control unit and the at least one aisle.

The at least one climate control unit and/or the at least on conveyor may each comprise a slave control unit connected to the master control unit. The slave control unit may be adapted to communicate with the master control unit and to accept control commands from the master control unit. In one realization, the slave control units is configured to control at least one of the cooling medium temperature (via the at least one climate control unit) and the flow rate of the cooling medium (via the at least one conveyor).

The system may further comprise a cover element sealing the aisle at a top end thereof. The cover element may be transparent so that light from an outside illumination may enter the aisle. Moreover, the cover element may include or be spaced apart from the racks by distance elements that are not permeable for the medium. In one implementation, the at least one bleeding opening is accommodated in at least one of the cover element and the distance elements.

The system may further comprise one or more terminating elements sealing the aisle at one or more lateral ends thereof. One or more of the lateral ends may also be closed by racks. The termination elements may comprise doors permitting servicing personal to enter and leave the aisle. The doors may be of transparent or opaque material and configured as sliding or swing doors. In one variant, the doors are swing doors that can be opened up to 180° to form part of an escape route for servicing personal.

In a still further implementation, the system comprises one or more grills for supplying the cooling medium to the aisle. The grills may, for example, be located at a top end if the cooling medium is supplied from above (e.g., within a cover element of the aisle) or at a floor of the aisle if the cooling medium is supplied from below. In order to increase the permeability of each grill for the cooling medium, at least 70%, and preferably more than 80% (e.g., 90% or more), of the surface area of the grill are permeable for the cooling medium. In one variant, the grill is located at a floor of the aisle and configured such that the servicing personal can walk on the grill.

The system may also comprise a duct configured to supply the cooling medium into the aisle. The duct may be situated essentially above or below the plurality of racks. The duct may be defined by a lower and an upper plane, wherein the upper plane defines a floor on which the racks are placed. The distance between the lower plane and the upper plane may lie for example between 150 mm and 1200 mm.

A portion of the space between the lower plane and the upper plane of the duct may be occupied by provisioning lines including power lines, communication lines (e.g. wire-based or fiber-optic lines) as well as supply and removal lines for fluid media such as liquids or gases. In the vicinity of the racks, the provisioning lines may extend through the upper plane and into the racks and/or the aisle. The locations where the provisioning lines pierce the upper plane may be sealed using, for example, brush strips or similar means.

The duct may be part of the medium circulation path. For example, the duct may essentially stretch between the least one climate control unit and/or the at least one conveyor on the one hand and the aisle on the other hand. Depending on whether the cooling medium is supplied to the aisle from above or from the bottom, the duct may either extend (at least partially) over the aisle or below the aisle. Moreover, the duct may be configured such that the cooling medium is supplied to a plurality of aisles simultaneously.

Each of the racks may comprise one or more mounting spaces for accommodating payload. Mounting spaces that are not occupied by payload may be sealed to prevent a significant flow of ambient medium into the aisle and/or a significant leakage of cooling medium out of the aisle. It should be noted that no 100% sealing is generally required, but any leaks will typically degrade the overall cooling efficiency of the system.

The payload situated in the mounting spaces may comprise electrically powered equipment. Such equipment may comprise computers (e.g. servers), mass storage devices, processing units, network elements such as switches, hubs, routers, and so on. The payload and in particular the electrically powered equipment may comprise a private medium conveyor (e.g., an internal fan) for conveying cooling medium from the supply side to the removal side of the rack. In one arrangement, all the payload inside a rack is arranged such that the supply sides of the private medium conveyors match the supply side of the rack, and the removal sides of the private medium conveyors match the removal side of the rack.

Each item of payload may comprise a controller for controlling the private medium conveyor (e.g., on the basis of payload parameters such as sensor readings or a determined state of the payload). Each item of payload may additionally comprise a communication mechanism for exchanging information about its internal state and the performance and current operating point of its private medium conveyor with other devices. Such other devices may include the master control unit, the at least one conveyor for conveying the cooling medium into the aisle and the at least one climate control unit.

The system may further comprise a housing in which the aisle is located. The housing can be adapted to close the circulation path of the cooling medium. The housing may comprise the floor, ceiling and walls of a data centre room. In one implementation, the at least one conveyor and/or the at least one climate control unit are situated inside or close to the housing. The climate control unit may, of course, also be situated outside the housing. In this case, further ducts may be provided to permit a flow of ambient medium from the housing to the climate control unit and a back flow of the cooling medium (e.g., of the cooled-down ambient medium). Similar to the climate control unit, the at least one conveyor for conveying the cooling medium into the aisle may likewise be located either within or outside the housing.

The climate control unit may be fed by the ambient medium (including, in the case of a closed circulation path, the heated-up cooling medium exiting the racks), perform climate control on the ambient medium so as to convert the ambient medium into the cooling medium, and then forward the cooling medium (with the help of the at least one conveyor) through the duct towards the aisle. In this way, the closed circulation path may be established.

According to a further aspect, a method for determining a climate condition of a rack system comprising a plurality of racks arranged to form an aisle between them is provided. The method comprises supplying a cooling medium into the aisle, wherein the aisle is sealed such that essentially all of the cooling medium supplied to the aisle passes to the racks, providing a bleeding opening enabling bleeding of the cooling medium out of the aisle and entering of an ambient medium into the aisle, and determining a medium flow direction through the bleeding opening. The medium flow direction may be regarded as being indicative or representative of a climate condition pertaining to the rack system.

The method may further comprise controlling at least one parameter of the cooling medium supplied to the aisle dependent on the medium flow direction. The at least one parameter may be selected from a set comprising a temperature, a humidity and flow rate of the cooling medium.

BRIEF DESCRIPTION OF THE DRAWINGS

In the following, further advantages and details of the present invention will be discussed with reference to the drawings, wherein:

FIG. 6a show two exemplary server racks that can be used for realizing an and 6b embodiment of a rack system;

DETAILED DESCRIPTION OF PREFERRED EMBODIMENTS

Figure 1:
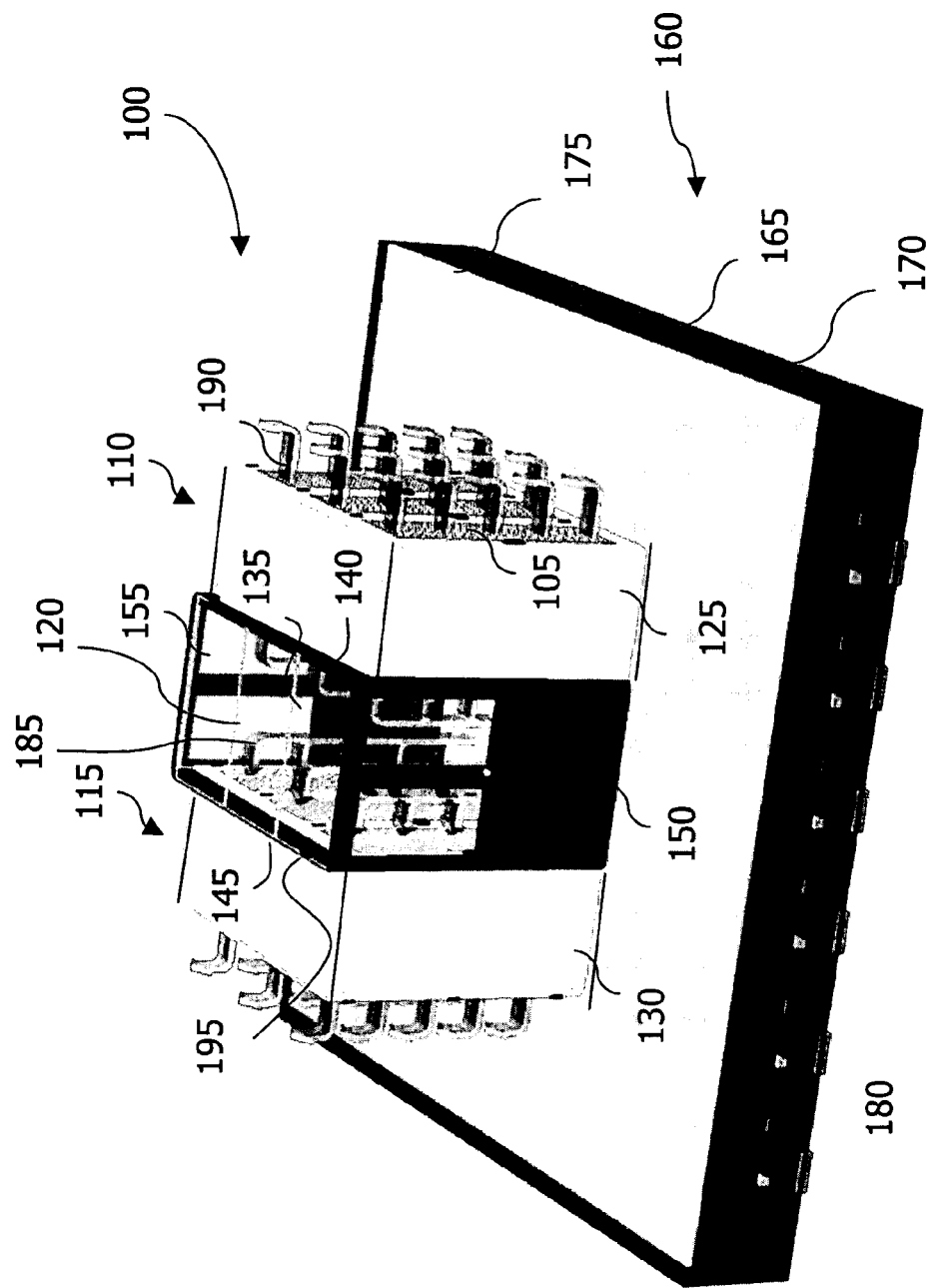
FIG. 1 shows a perspective view of a rack system embodiment.

FIG. 1 shows a perspective view of an embodiment of a rack system 100. The rack system 100 is housed in a data centre room (not shown) that may additionally contain further rack systems.

The rack system 100 comprises a plurality of individual racks 105. The racks 105 are arranged "front-to-front" in two parallel rows 110, 115 such that an aisle 120 is formed between them. In the embodiment shown in FIG. 1, each row 110, 115 of racks 105 is additionally enclosed by a respective cabinet 125, 130.

The individual racks 105 define mounting spaces for electrically powered equipment (not shown). In the present embodiment, the electrically powered equipment comprises computer servers and mass storage devices with internal private medium conveyors (such as fans) for propelling a cooling medium through a chassis thereof. The electrically powered equipment is arranged in the racks 105 such that a medium supply side of each item of electrically powered equipment faces the aisle 120, and a medium removal side faces the opposite direction. The media supply sides and the media removal sides of the electrically powered equipment thus define the medium supply sides and medium removal sides of the individual racks 105.

As shown in FIG. 1, the aisle 120 is sealed in such a manner that essentially all of a cooling medium supplied to the aisle 120 passes through the racks 105. In other words, the cooling medium is substantially prevented from exiting the aisle 120 in other directions than through the racks 105. It should be noted in this regard that no complete sealing of the aisle 120 is required (nor technically possible with reasonable technical efforts). In other words, a certain leakage of cooling medium will in many cases be tolerable as long as the leakage does not substantially degrade the cooling efficiency.

In the embodiment shown in FIG. 1, several sealing members are provided to enclose the aisle 120 in the aisle portions not limited by the rack cabinets 125, 130 housing the racks 105. Specifically, a cover element 135 is sealing the aisle 120 at a top end thereof. The cover element 120 is made from a transparent material such as acrylic glass and permits light from the data centre illumination enter the aisle 120. The cover element 135 comprises lateral distance elements 140, 145 so that the plane defined by the cover element 120 is spaced apart from the plane defined by the upper ends of the two cabinets 125, 130.

The sealing members enclosing the aisle 120 additionally comprise two lateral terminating elements 150, 155. The terminating elements 150, 155 are configured as swing doors allowing servicing personal to enter and leave the aisle 120. It should be noted that one of the lateral terminating elements 150, 155 could be replaced by a cabinet housing one or more further racks 105. Moreover, alternative door constructions such as sliding doors could be used as well.

Cooling medium such as air is provided to the aisle 120 via a floor of the aisle, i.e. from the bottom. To this end, an elevated floor system 160 is provided. The elevated floor system 160 defines a duct 165 between a lower plane 170 and an upper plane 175 of the elevated floor system 160. As shown in FIG. 1, the rack cabinets 125, 130 and the aisle 120 defined between them are located on the upper plane 175.

The upper plane 175 of the elevated floor system 160 includes a plurality of openings (not shown in FIG. 1) for fluidically connecting the aisle 120 to the duct 165. A cooling medium fed into the duct 165 as illustrated by the arrows 180 can thus enter aisle 120. Due to the sealing members enclosing the aisle 120, the cooling medium entering the aisle 120 can leave the aisle 120 only through the racks 105 as indicated by arrows 185. Specifically, the private medium conveyors of the electrically powered equipment situated in mounting spaces of the racks 105 convey the cooling medium entering the aisle 120 through the racks 105. The cooling medium thus conveyed through the racks 105 is heated-up by the heat dissipated from the electronically powered equipment and leaves the racks 105 as indicated by arrows 190.

The path of the heated-up cooling medium exiting the racks 105 can be closed by cooling down (and, optionally, dehumidifying) the heated-up cooling medium leaving the racks 105 and by feeding the cooled-down (and, optionally, dehumidified) medium again into the duct 165. It should be noted that in other embodiments, the medium flow path need not be closed. In such embodiments the heated-up cooling medium leaving the racks 105 may simply be conveyed out of the data centre into the environment.

It is evident that the parameters of the cooling medium supplied via the duct 165 have to be tightly controlled to make sure that heat generated by the electrically powered equipment can be efficiently dissipated, preventing any undesirable heat build-up within the racks 105. On the other hand, it is apparent that an excessive adjustment of the cooling medium parameters (e.g., an excessive cooling down) should be avoided to increase energy efficiency.

To efficiently control one or more parameters of the cooling medium supplied to the aisle 120, a sensing arrangement 195 is provided at a top end of the aisle 120. The sensing arrangement 195 comprises a bleeding opening in the distance element 145 together with a sensor located closed to the bleeding opening (the placement of the bleeding opening and of the sensor will be described in more detail with reference to FIG. 2 later on).

The bleeding opening, which may have a fixed or adjustable diameter ranging for example anywhere between 10 cm$^2$ and 500 cm$^2$ (e.g., between 80 cm$^2$ and 200 cm$^2$), is provided to enable a bleeding of the cooling medium out of the aisle 120 and an entering of an ambient medium into the aisle 120. In other words, depending on the pressure difference between the ambience of the aisle 120 and the aisle 120, cooling medium will either leave the aisle 120 via the bleeding opening, or ambient medium will enter the aisle 120 via the bleeding opening. The sensor provided in the vicinity of the bleeding opening is configured to determine a medium flow direction through the bleeding opening. Thus, the medium flow direction sensed by the sensor is indicative or representative of a climate condition within the aisle 120 in relation to the cooling medium. Dependent on the medium flow direction thus sensed by the sensor, one or more parameters of the cooling medium can be controlled to allow for an energy-efficient cooling of the electrically powered equipment mounted in the racks 105.

In the following, one exemplary embodiment for controlling a parameter of the cooling medium based on the sensing arrangement 195 will be discussed in context with the schematic control diagram of FIG. 2. In the specific embodiment shown in FIG. 2, the same reference numerals as in FIG. 1 will be used to designate the same or similar elements.

Figure 2:
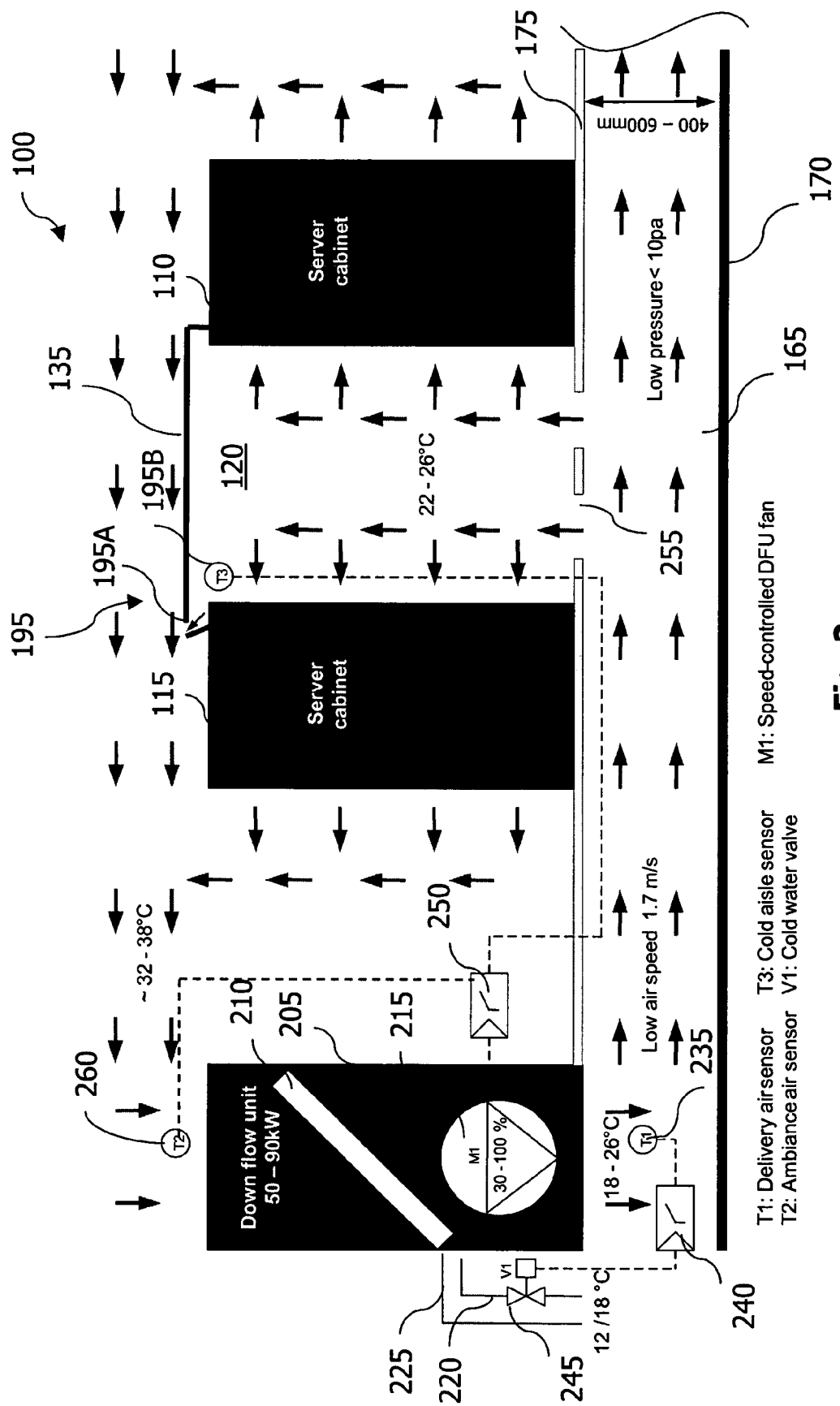
FIG. 2 shows an embodiment of a rack system control layout.

The control embodiment as illustrated in FIG. 2 is based on a closed circulation path of the cooling medium. The closed circulation path comprises at least one down flow unit 205 located within the data centre room that also houses the aisle 120. In alternative embodiments, the down flow unit 205 could be located outside this room provided that it remains in fluid communication therewith in a similar manner as shown in FIG. 2.

The down flow unit 205 comprises two dedicated components in a single housing, namely a climate control unit 210 on the one hand and a cooling medium conveyor 215 on the other hand. The climate control unit 210 is a so-called chiller, which is attached to a cold water supply tube 220 and a warm water removal tube 225. The cold water supplied via the tube 220 may have a temperature of approximately 5 to 15° C. (e.g., between 11 and 13° C.). The warm water removed via tube 225 may have a temperature of approximately 12 to 22° C. (e.g., between 16 and 19° C.).

Ambient medium passing through the climate control unit 210 is brought into thermal contact with the cold water and thus cooled down. At the same time, the cold water is heated-up and removed from the climate control unit 210 via the warm water removal tube 225. Optionally, the ambient medium is additionally subjected to a dehumidifying step in the climate control unit 210.

The conveyor 215 conveys the cooled-down ambient medium as cooling medium into the duct 165. In the vicinity of where the cooling medium is fed into the duct 165, a temperature sensor 235 coupled to a control unit 240 is provided. The temperature sensor 235 is configured to sense the current temperature of the cooling medium. In the control unit 240, the current temperature of cooling medium is then compared with a temperature set point, and a cold water supply valve 245 located in the cold water supply tube 220 is controlled dependent on a result of this comparison.

The cold water supply valve 245 controls the flow of cold water through the climate control unit 210 such that the medium temperature sensed by the sensor 235 approaches or equals a specific temperature set point. As illustrated in FIG. 2, the temperature of the cooling medium entering the duct 165 will typically be set to a value in the range between approximately 18 and 26° C. (e.g. at 20, 21, 22, 23 or 24° C.).

In the embodiment illustrated in FIG. 2, control of the cooling medium temperature is performed autonomously. In other words, the control unit 240 operates solely on the signal generated by the temperature sensor 235. In other embodiments, the control unit 240 may additionally, or in the alternative, take into account the signals of one or more other sensors shown in FIG. 2 and discussed hereinafter.

As has been mentioned above, the ambient medium cooled down by the climate control unit 210 is propelled by the conveyor 215 into the duct 165. The conveyor 215 is configured as a fan the speed of which being controllable to adjust the flow rate (medium speed) of the cooling medium supplied into the duct 165 under control of a dedicated control unit 250. During normal operation, the conveyer 215 may propel the cooling medium at a speed of 1 to 3 m/s (e.g., at approximately 1.5 to 2.2 m/s).

In order to achieve a desired flow rate of the cooling medium, the required medium speed depends on the height of the duct 165 along which the cooling medium is propelled from the down flow unit 205 to the aisle 120. The medium speed values mentioned above correspond to a nominal duct height of approximately 400 to 600 mm. In cases of smaller duct heights (of, e.g., 150 mm), the speed may need to be increased, and in cases of larger duct heights (of, e.g. 800 mm), the speed may need to be reduced. Generally, the medium speed and the height of the duct 165 are selected such that the medium pressure inside the duct 165 is comparatively low, for instance no more than 20 pa (e.g., no more than 10 pa) over the medium pressure inside the data centre outside the aisle 120.

As illustrated in FIG. 2, the cooling medium propelled through the duct 165 (at a speed of approximately 1.7 m/s and at an increased pressure of less than 10 pa compared to the pressure inside the data centre) enters the aisle 120 via openings 255 in the upper floor plane 175. Inside the aisle 120, a medium temperature of typically 22 to 26° can thus be maintained, which is significantly lower than the ambient temperature of 32 to 38°. As indicated by the arrows in FIG. 2, the cooling medium entering the aisle 120 will be conveyed by the private medium conveyors of the electrically powered equipment to the outside of the aisle 120 and will at the same time be heated-up when taking up heat within the electrically powered equipment. The heated-up cooling medium constitutes the ambient medium that will flow back to the down flow unit 205 thus establishing a closed flow circuit.

With reference to FIG. 2, the sensing arrangement 195 comprises a bleeding opening 195A located at a top end of the aisle 120 as well as a temperature sensor 195B located in the vicinity of the bleeding opening 195A. While the temperature sensor 195B is shown to be located inside the aisle 120, the temperature sensor 195B could alternatively be positioned inside the bleeding opening 195A or outside the aisle 120 but close enough to the bleeding opening 195A so as to detect a medium flow through the bleeding opening 195A. While in the embodiment illustrated in FIG. 2 the sensor 195B is configured as a temperature sensor, it will be appreciated that other sensor types capable of determining a medium flow direction through the bleeding opening 195A could be used as well.

The temperature sensor 195B is electrically connected to the control unit 250 associated with the conveyor 215. In other words, a sensor signal indicative of a medium flow direction through the bleeding opening 195A is used to control the speed (and thus the flow rate) of the cooling medium such that the appropriate volume of cooling medium is fed to the aisle 120. In a further mode, the conveyor 215 may additionally be controlled dependent on the signal of a further (optional) temperature sensor 260 located outside the aisle 120 and preferably close to an intake of the down flow unit 205.

In the following, the control of the conveyor 215 located in the down flow unit 205 will be described in more detail with reference to the flow chart 300 of FIG. 3.

Figure 3:
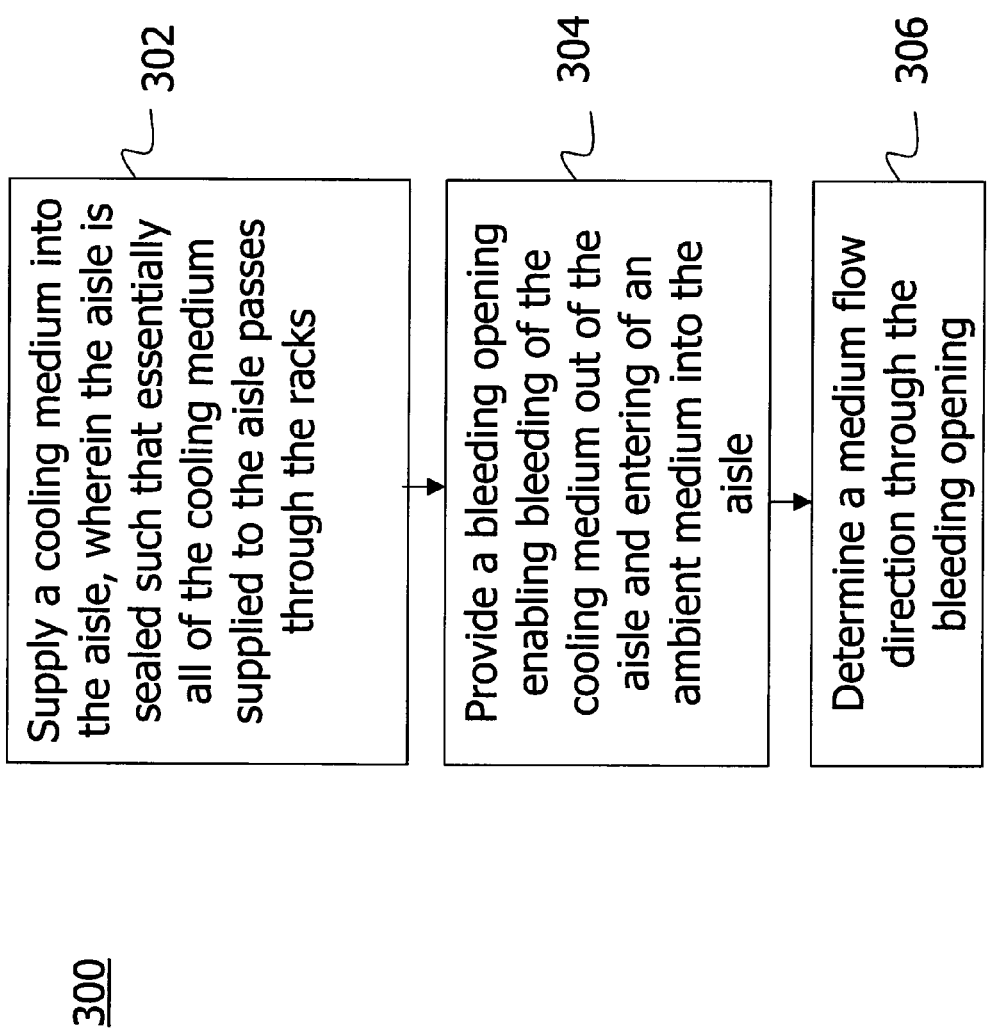
FIG. 3 shows a schematic diagram of a first method embodiment.

Referring to the flow chart 300 of FIG. 3, the control operation with respect to the conveyor 215 starts with supplying the cooling medium into the aisle 120 (step 302). The cooling medium will thus fill the aisle 120 from the bottom until it reaches the cover element 135 (and thus the temperature sensor 195B). As the aisle 120 is sealed both laterally and on its top (see FIG. 1), essentially all of the cooling medium entering the aisle 120 through the opening 255 will pass trough the racks 105 and can thus be utilized for an efficient heat dissipation within the electrically powered equipment mounted in the racks 105.

Should the equipment inside the racks 105 require to dissipate more heat (and therefore require more cooling), the private medium conveyors of the equipment will propel more cooling medium from the aisle 120 through the racks 105. As a result, the pressure inside the aisle 120 with respect to the ambience will drop slightly. As a consequence of this pressure drop inside the aisle 120, warm ambient medium will be sucked in through the bleeding opening 195A into the aisle 120 (step 304). The resulting medium flow direction through the bleeding opening 195A can be sensed by the temperature sensor 195b in the form of a temperature increase (step 306). Specifically, the ambient medium sucked into the bleeding opening 120 and passing the temperature sensor 195B has a higher temperature then the environment of cooling medium prevailing in the vicinity of the temperature sensor 195B prior to the pressure drop within the aisle 120.

The temperature rise at the location of the temperature sensor 195B will be detected by the control unit 250 (e.g., by comparison with a predefined temperature set point derived from the current temperature set point applied by the control unit 240) and can be interpreted as a request for more cooling medium 120. As a result, the control unit 250 controls the conveyer 215 such that the medium speed (and thus the flow rate) increases. Therefore, more cooling medium per time unit is propelled through the duct 165. Due to the pressure drop inside the aisle 120 that resulted in the entering of ambient medium through the bleeding opening 195A into the aisle 120, more cooling medium flow into the aisle 120.

Once slightly more cooling medium is introduced into the aisle 120 per time unit than is propelled by the private medium conveyors through the racks 105 out of the aisle 120, the cooling medium level within the aisle 120 will again gradually rise up to the position of the temperature sensor 195B. At the same time, the pressure difference between the aisle 120 and the ambience will decrease until no more ambient medium is sucked through the bleeding opening 195A into the aisle 120. In other words, the temperature sensor 195B will eventually again be located in an environment of cooling medium, and the resulting temperature drop can be detected by the control unit 250. Specifically, the control unit 250 can determine that enough cooling medium is fed into the aisle 120 and can start gradually decreasing the speed (and thus the flow rate) of cooling medium through the duct 165 until the specific temperature set point associated with the temperature sensor 195B is reached again.

This temperature set point above may lie a few degree Celsius (e.g., 1 to 8° C.) above the average temperature of the cooling medium entering the aisle 120. For example, the temperature set point may be dynamically defined based on the cooling medium temperature (as measured by the temperature 235) adjusted by the control unit 240. A set point has the advantage that the control scenario that can be implemented by the control unit 250 is not restricted to increasing the flow rate starting from a specific nominal flow rate, but can also start with an initial flow rate decrease. Accordingly, should the electrically powered equipment located in the racks have less power to dissipate (and should their private medium conveyors therefore propel less cooling medium from the aisle 120 through the racks 105), the temperature sensed by the temperature sensor 195B may drop with respect to the temperature set point. This temperature decrease can be interpreted by the control unit 250 as an excess of cooling medium supplied to the aisle 120, and the propelling of cooling medium into the duct 165 (i.e. the medium speed) may be decreased.

In an optional control scenario, the control unit 250 additionally takes a signal generated by the further temperature sensor 260 (if present) into account when controlling the conveyor 215. Specifically, the control unit 250 may control the conveyor 215 responsive to a temperature difference between the temperature sensed by temperature sensor 260 on the one hand and the temperature sensed by the temperature sensor 195B on the other. For example, the control unit 250 may be configured to control the flow rate of the cooling medium such that if a predetermined temperature difference between the temperatures measured by the two temperature sensors 195B, 260, respectively, decrease because the temperature sensed by the temperature sensor 195B rises, the flow rate of cooling medium is increased, and vice versa.

Figure 4:
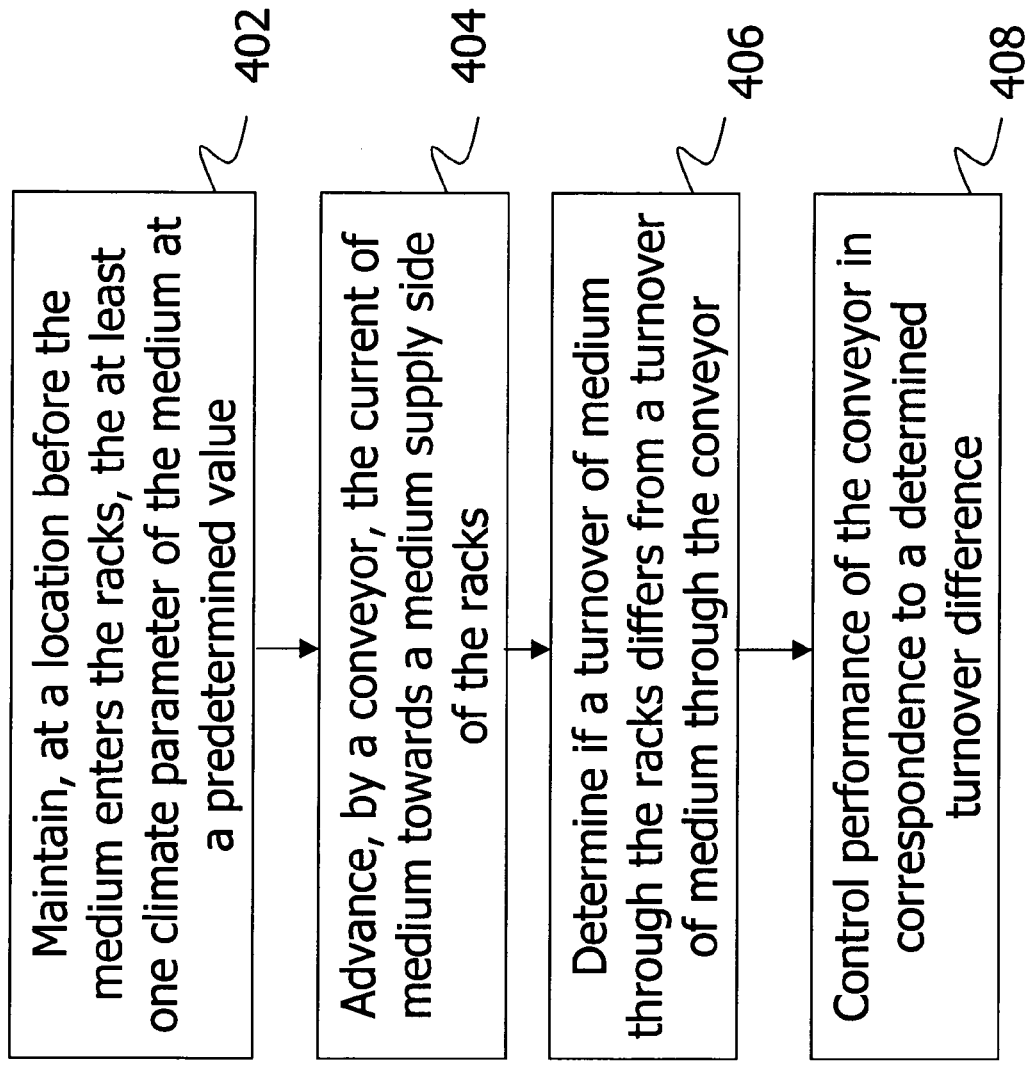
FIG. 4 shows a schematic diagram of a second method embodiment.

In the following, a further embodiment for controlling the conveyor 215 will be described with reference to the flow chart 400 of FIG. 4. The control embodiment illustrated in FIG. 4 can be performed concurrently or as an alternative to the control embodiment discussed above in context with FIG. 3.

In a first step 402, the temperature (as an exemplary parameter) of the cooling medium is maintained at a predetermined temperature value before the cooling medium enters the aisle 120 and the racks 105. As has been described above, the step of maintaining the cooling medium temperature at a predetermined value is performed by the climate control unit 210 under control of the control unit 240 that adjusts the valve 245 responsive to a temperature detected by the temperature sensor 235.

In step 404, the cooling medium is advanced by the conveyor 215 through the duct 165 into the aisle 120 and to the medium supply sides of the racks 105. Then, in step 406, it is determined if a turnover of cooling medium through the racks 105 differs from a turnover of cooling medium through the conveyor 215.

In a further step 408, the conveyor 215 is controlled dependent on the turnover difference determined in step 406. This control may, for example, target at minimizing the turnover difference or at keeping the turnover difference at a predetermined value.

It should be noted that steps 402 to 408 will in a typically scenario be performed concurrently and repeatedly. Moreover, as has been explained above, the turnover difference and any changes in the turnover difference may be detected based on a signal provided by the temperature sensor 195B or any other sensor capable of determining a flow direction through the bleeding opening 195A.

As a result of the control approach illustrated in FIGS. 1 to 4 in relation to the conveyor 215, the power consumption of the conveyor 215 can be reduced as the speed of its fan can be selectively decreased in situations in which the electrically powered equipment mounted in the racks 105 requires less cooling.

While the embodiments discussed above comprise only a single sensing arrangement 195, it will be appreciated that two or more such sensing arrangements 195 could be located at spaced-apart positions in the upper portion of the aisle 120. In such a situation, the temperature sensor 195B of each sensing arrangement 195 will be electrically coupled to the control unit 250. The control unit 250 may then perform its control tasks based on the highest temperature value detected by any of the temperature sensors 195B. Moreover, it will be appreciated that also the number of aisles 120 coupled to the duct 165 may be increased as required. In this regard, reference is made to the schematic rack system layout illustrated in FIG. 5. Again, identical reference numerals will be used to identify the same or similar components.

Figure 5:
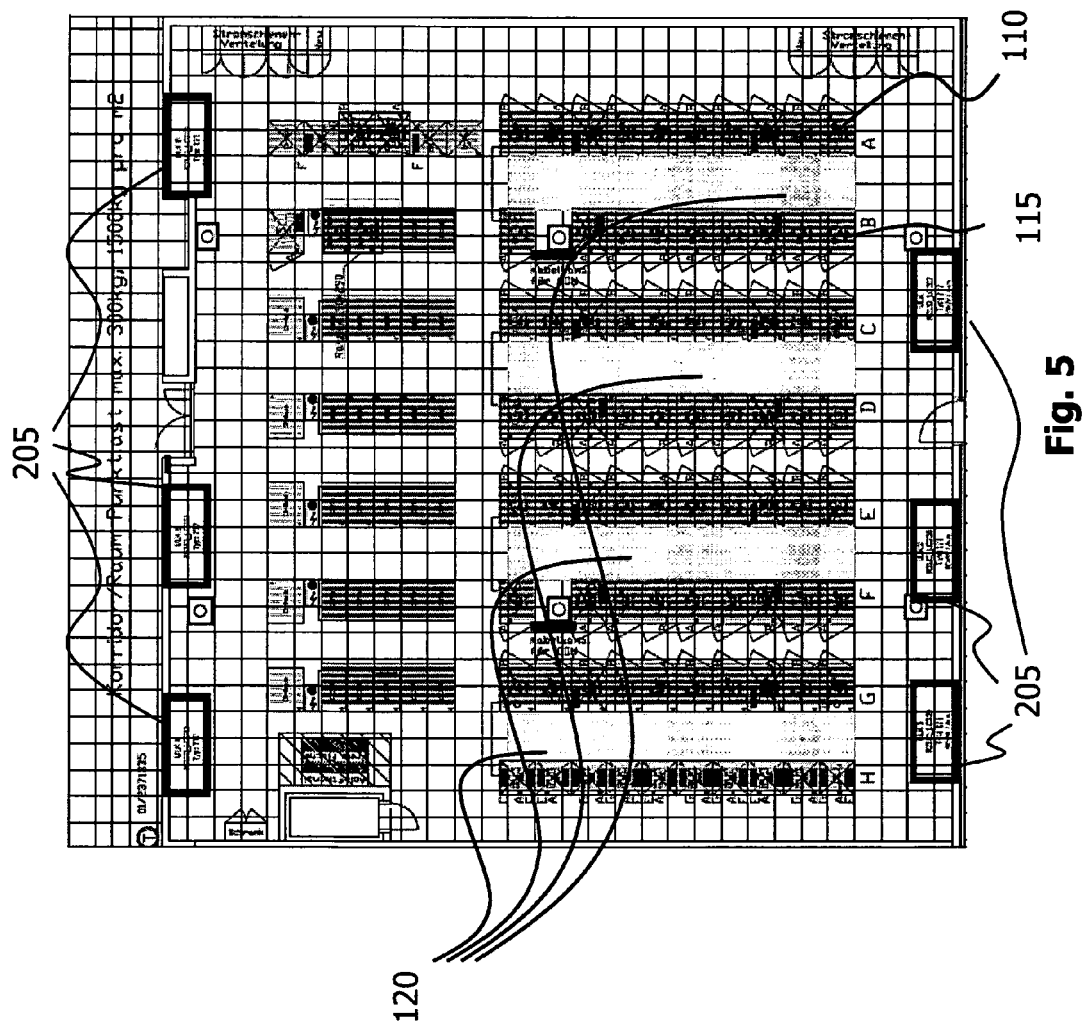
FIG. 5 shows a top view of a data centre comprising a multi-aisle rack system.

According to the rack system layout shown in FIG. 5, four parallel aisles 120 are provided, each aisle 120 being defined by two parallel rows 110, 115 of racks (only two rows are specifically denoted in FIG. 5). The individual aisles 120 are all coupled to the same duct (see reference numeral 165 in FIGS. 1 and 2). Each row 110, 115 of racks comprises either 9 or 10 rack units. Each aisle 120 comprises at least one sensing arrangement 195.

The aisles 120 are provided with cooling medium from six individual down flow units 205. A master control unit (not shown) is responsible for down flow unit management, and the six down flow units 205 are connected as slave units to the master control unit. The master control unit incorporates the control functions discussed above in connection with the control unit 250 plus additional control functions for down flow unit management.

The master control unit is configured to perform its control operations responsive to the highest temperature detected by any of the sensing arrangements 195 distributed over the individual aisles 120. Depending on the cooling requirements, the master control unit switches individual down flow units on, off or into a standby mode. Additionally, the master control unit controls the fan speed of the conveyors associated with down flow units 205 that have been switched on (in a range between 30 to 100% of the maximum speed) dependent on the detected maximum temperature. While the master control unit thus centrally controls the total flow rate of the cooling medium, each down flow unit 205 may autonomously and locally control temperature and humidity of the cooling medium passing the individual down flow unit 205. The temperature and humidity control of the individual down flow units may be based on a temperature set point received from the master control unit.

The overall control concept is identical to the control concept discussed above in context with FIGS. 1 to 4. In other words, in a first step the maximum temperature detected by any of the distributed sensing arrangements 195 is compared to a temperature set point. In a specific example, the temperature set point is set to be 1 to 6° C. (e.g. 2 to 4° C.) higher than the temperature set point applied by the control unit 240 (see FIG. 2). If the maximum temperature detected by any temperature sensor 195B is lower than the temperature set point applied by the master control unit, this is an indication that the down flow units 205 deliver too much cooling medium to the individual aisles 120. Accordingly, the flow rate of cooling medium will be decreased. If, on the other hand, the maximum temperature is higher than the temperature set point, this can be seen as an indication that the down flow units 205 deliver not enough cooling medium to the individual aisles 120. Accordingly, the flow rate of cooling medium will be increased. As mentioned above, possible measures for controlling the flow rate include switching individual down flow unit 205 on or off, and controlling the fan speed of the down flow units 205 that have been switched on. Control strategies that may be applied by the controllers 240, 250 shown in FIG. 2 and the master control unit include a PI control which, as such, is known in the art.

FIG. 6 illustrates an embodiment of a rack 105 that comprises a plurality of mounting spaces for accommodating payload including electrically powered equipment. Specifically, FIG. 6a shows the empty rack 105 that may form the basis for the rack systems discussed above in context with FIGS. 1 to 5. Unused mounting spaces of the rack 105 may be covered with blanking panels as shown in FIG. 6b. The blanking panels ensure that cooling medium supplied to the aisle 120 does not leak out of the racks 105. It should again be noted here that no 100% sealing is required to permit an efficient cooling operation.

Figure 7:
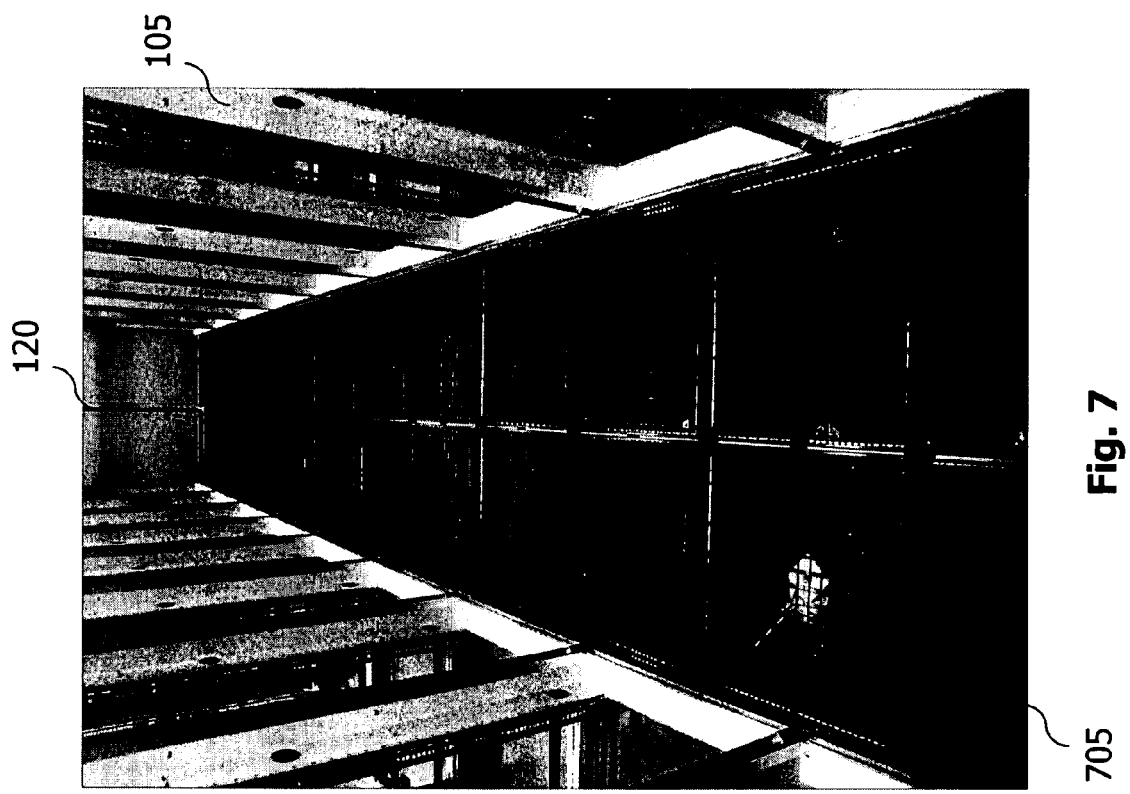
FIG. 7 shows a photograph of an aisle including a floor grill and two parallel rows of racks.

FIG. 7 shows an illustration of the floor of the aisle 120. As can be seen in FIG. 7, the floor is completely covered by a grill 705. The grill 705 has a large open surface area. Specifically, approximately 90% of the surface area of the grill 705 is permeable for the cooling medium. As a result of using the grill 705 as illustrated in FIG. 7, only a comparatively small pressure difference between the duct 165 on the one hand and the ambience of the aisle 120 on the other is required to efficiently supply cooling medium to the aisle 120, which again permits operating the conveyors inside the down flow units at low speeds. As has been mentioned above, a pressure difference of less than 10 pa will in many cases be sufficient.

Figure 8:
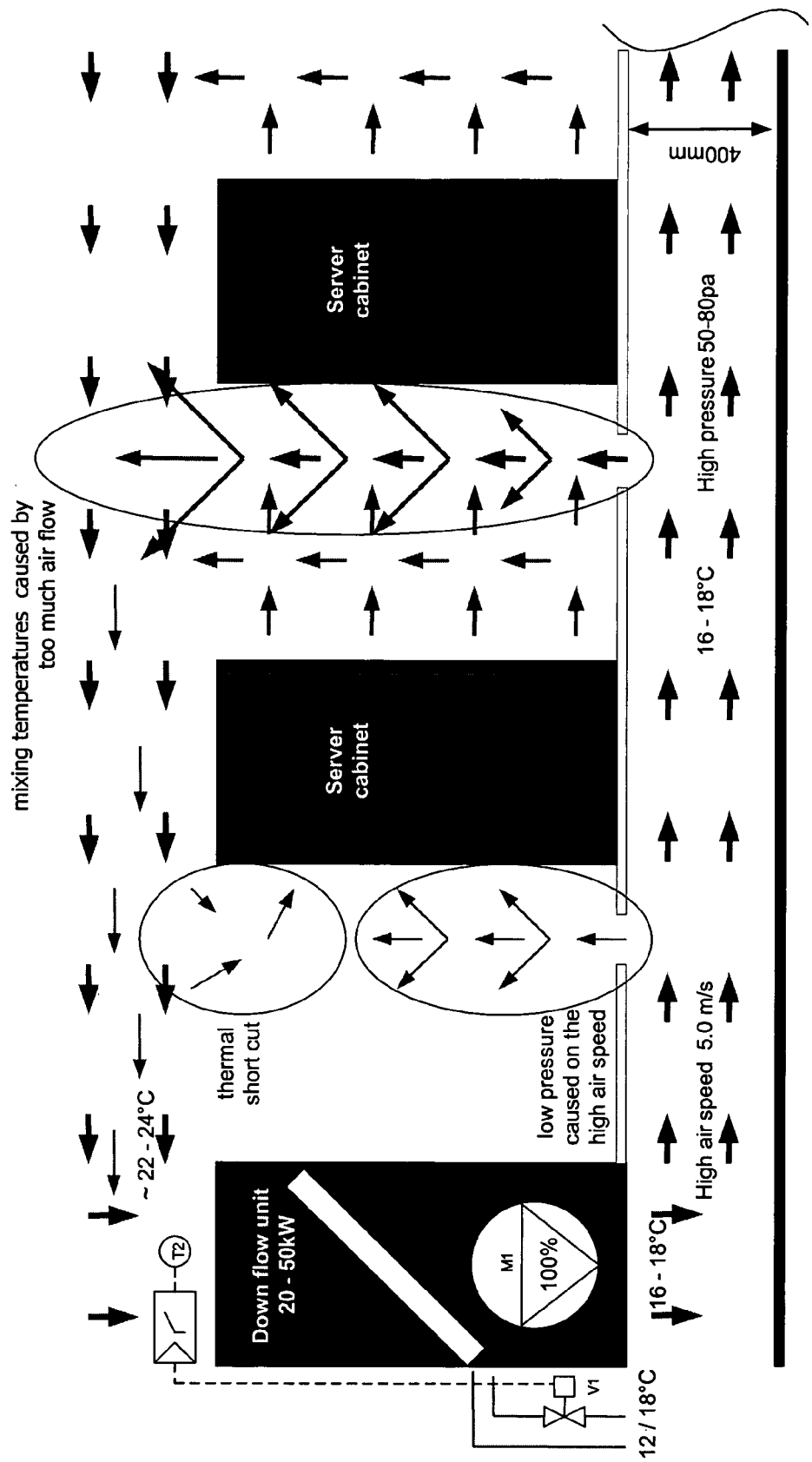
FIG. 8 shows a rack system layout without separation of cold and warm aisles.
Figure 9:
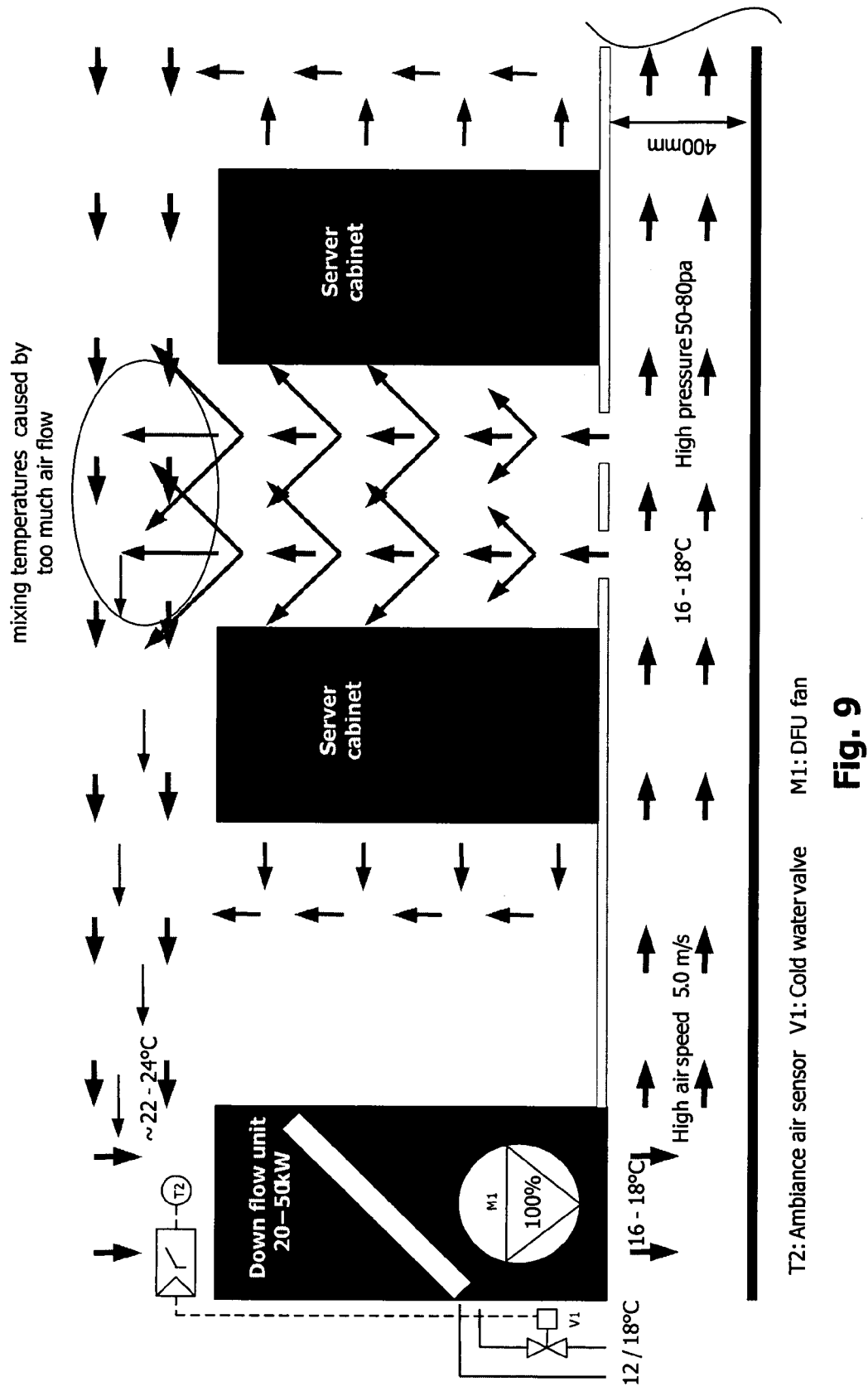
FIG. 9 shows another rack system layout without separation of cold and warm aisles.

The various cooling approaches discussed herein provide significant advantages over prior art cooling approaches as illustrated, for example, in FIGS. 8 and 9. FIG. 8 shows a rack system layout without cold and hot aisle separation. This kind of rack system layout is common in data centres that host legacy systems and that were not specifically tailored to support a ventilation path inside the data centre. As can be seen in the ellipses, there are various regions in which fresh cooling medium supplied from the floor and heated-up cooling medium exiting the racks gets mixed. Such a mixing reduces the cooling efficiency of the data centre significantly. FIG. 9 shows another variant of a rack system layout inside the data centre, this time with cold and hot aisle separation. As shown by the ellipsis, there is still a zone where fresh cooling medium and heated-up cooling medium can mix.

Comparing the operational parameters shown for the rack system layouts in FIGS. 8 and 9 with the operational parameters shown in FIG. 2, it becomes apparent that the cooling approach discussed herein can be incorporated using much lower medium speeds and pressure differences. Additionally, the cooling medium exiting the down flow units 205 need not be cooled as much as in the legacy approaches, which also adds to the overall cooling efficiency.

Figure 10:
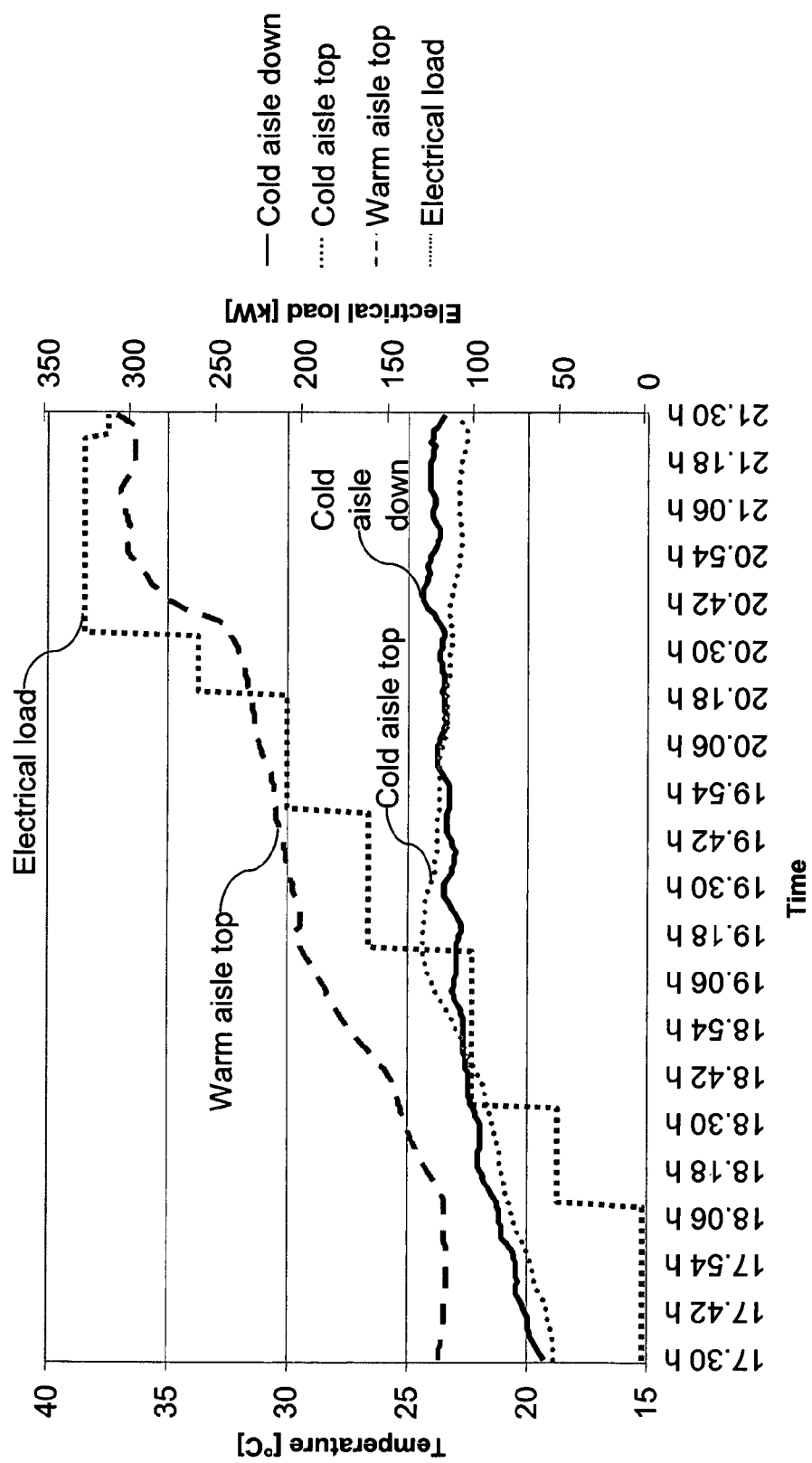
FIG. 10 shows a diagram illustrating the results of a load test.

The improved cooling efficiency of the techniques discussed herein is also illustrated in the diagram of FIG. 10. As becomes apparent from FIG. 10, the temperatures in the top and bottom regions of the aisle 120 (termed "cold aisle" in FIG. 10) can be kept well below the critical temperature of 25° even if the electrical load and thus the heat that needs to be dissipated increases significantly. Instead of affecting the cold aisle temperature, any increases of the electrical load only lead to a heating up of the data room outside the aisle 120 (termed "warm aisle" in FIG. 10).

Accordingly, FIG. 10 illustrates that the approaches discussed herein lead to a high cooling efficiency. At the same time, the energy costs and the running time of the down flow units 205 (and in particular of the conveyors 215) can be significantly to reduced compared to conventional techniques. As a further side effect, the fan speeds of the conveyors 215 can be lowered in most operational conditions, which leads to significant decreases of the noise inside the data centres.

While the present invention has been described with respect to particular embodiments, those skilled in the art will recognize that the present invention is not limited to the specific embodiments described and illustrated herein. Therefore, it is to be understood that this disclosure is only illustrative. Accordingly, it is intended that the invention be limited only by the scope of the claims appended hereto.

The invention claimed is:

1. A rack system, comprising:
a plurality of racks arranged to form at least one aisle between them, wherein the aisle is sealed by a cover element at the top end of the aisle such that essentially all of a cooling medium supplied to the aisle passes through the racks;
a bleeding opening for enabling within the cover element bleeding of the cooling medium out of the aisle and entering of an ambient medium into the aisle, wherein the bleeding opening has a fixed or adjustable opening size ranging between 10 cm$^2$ and 500 cm$^2$;
a first sensor located close to or in the bleeding opening for determining a medium flow direction through the bleeding opening; and
a control mechanism adapted to automatically control at least one parameter of the cooling medium supplied to the aisle dependent on a signal generated by the first sensor, the signal being indicative of the medium flow direction.

2. The system of claim 1, wherein the first sensor is located close to the bleeding opening.

3. The system of claim 2, wherein the first sensor is selected from the group consisting of a temperature sensor, an air-screw and a sail-operated switch.

4. The system of claim 1, wherein the bleeding opening is located at a top end of the aisle.

5. The system of claim 1, wherein the at least one parameter is selected from the group consisting of a temperature, a humidity and a flow rate of the cooling medium.

6. The system of claim 1, further comprising at least one conveyor for conveying the cooling medium into the aisle.

7. The system of claim 6, wherein the at least one conveyor is adapted to control a flow rate of the cooling medium supplied to the aisle dependent on a signal generated by the first sensor.

8. The system of claim 1, further comprising at least one climate control unit for controlling at least one of a temperature and a humidity of the cooling medium supplied to the aisle.

9. The system of claim 8, wherein the at least one climate control unit is adapted to control at least one of the temperature and the humidity of the cooling medium dependent on a signal generated by the first sensor.

10. The system of claim 1, further comprising at least one second sensor, wherein at least one of the control mechanism, the conveyor and the climate control unit is further controlled dependent on a signal generated by the second sensor.

11. The system of claim 10, wherein the at least one second sensor is located at a distance from at least one of the bleeding opening and the first sensor.

12. The system of claim 1, further comprising a grill for supplying the cooling medium to the aisle, the grill being located at a floor of the aisle.

13. The system of claim 1, further comprising a duct configured to supply the cooling medium into the aisle.

14. The system of claim 13, wherein the duct is configured to supply the cooling medium to a plurality of aisles.

15. The system of claim 13, wherein the duct is situated essentially below the plurality of racks.

16. The system of claim 1, wherein each of the racks has a supply side for supplying the cooling medium to the rack and a removal side opposite the supply side for removing the cooling medium from the rack, wherein the supply sides of the rack are arranged to face the interior of the aisle.

17. The system of claim 1, further comprising electrically powered equipment requiring cooling, the electrically powered equipment being situated in mounting spaces of the racks.

18. The system of claim 1, further comprising a housing in which the aisle is located, the housing being adapted to close a circulation path of the cooling medium.

19. A method for determining a climate condition of a rack system comprising a plurality of racks arranged to form an aisle between them, the method comprising:
 supplying a cooling medium into the aisle, wherein the aisle is sealed by a cover element at the top end of the aisle such that essentially all of the cooling medium supplied to the aisle passes through the racks;
 providing a bleeding opening within the cover element enabling bleeding of the cooling medium out of the aisle and entering of an ambient medium into the aisle, wherein the bleeding opening has a fixed or adjustable opening size ranging between 10 $cm^2$ and 500 $cm^2$;
 determining a medium flow direction through the bleeding opening using a first sensor located close to or in the bleeding opening; and
 automatically controlling at least one parameter of the cooling medium supplied to the aisle dependent on the medium flow direction.

20. The method of claim 19, wherein the at least one parameter is selected from the group consisting of a temperature, a humidity and a flow rate of the cooling medium.

21. The system of claim 7, further comprising at least one second sensor, wherein at least one of the control mechanism, the conveyor and the climate control unit is further controlled dependent on a signal generated by the second sensor.

22. The system of claim 9, further comprising at least one second sensor, wherein at least one of the control mechanism, the conveyor and the climate control unit is further controlled dependent on a signal generated by the second sensor.

23. The system of claim 14, wherein the duct is situated essentially below the plurality of racks.

* * * * *

UNITED STATES PATENT AND TRADEMARK OFFICE
CERTIFICATE OF CORRECTION

| | | |
|---|---|---|
| PATENT NO. | : 8,690,651 B2 | Page 1 of 1 |
| APPLICATION NO. | : 12/742003 | |
| DATED | : April 8, 2014 | |
| INVENTOR(S) | : Honold et al. | |

It is certified that error appears in the above-identified patent and that said Letters Patent is hereby corrected as shown below:

ON THE TITLE PAGE:

At item (73), Assignee, change:

"(73) Assignee: Knurr AG, Arnstorf (DE)"

To be

--(73) Assignee: Knürr AG, Arnstorf (DE)--.

Signed and Sealed this
Second Day of September, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,690,651 B2  Page 1 of 1
APPLICATION NO. : 12/742003
DATED : April 8, 2014
INVENTOR(S) : Honold et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 960 days.

Signed and Sealed this

Twenty-ninth Day of September, 2015

Michelle K. Lee
*Director of the United States Patent and Trademark Office*